(12) United States Patent
Bernstein (10) Patent No.: US 6,455,980 B1
(45) Date of Patent: Sep. 24, 2002

(54) RESONATOR WITH PREFERRED OSCILLATION MODE

(75) Inventor: Jonathan J. Bernstein, Medfield, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/649,290

(22) Filed: Aug. 28, 2000

(51) Int. Cl.⁷ .............................................. H01L 41/08

(52) U.S. Cl. .................. 310/324; 310/321; 310/313 R; 310/324

(58) Field of Search ................................ 310/311, 321, 310/322, 324, 366, 313 R, 313 B (56) References Cited

U.S. PATENT DOCUMENTS

| | | | |
|---|---|---|---|
| 3,634,787 A | * 1/1972 | Newell | 310/321 X |
| 4,138,652 A | 2/1979 | Nishikawa et al. | 333/82 R |
| 4,294,105 A | * 10/1981 | Kelly | 310/321 X |
| 4,517,486 A | * 5/1985 | Andrews | 310/321 X |
| 5,285,127 A | 2/1994 | Egley et al. | 310/366 |
| 5,956,292 A | * 9/1999 | Bernstein | 310/324 X |
| 6,271,619 B1 | * 8/2001 | Yamada et al. | 310/324 |

OTHER PUBLICATIONS

Liu et al., "Sealing of Micromachined Cavities Using Chemical Vapor Deposition Methods: Characterization and Optimization," *IEEE Journal of Microeleltromechanical Systems*, vol.8, No. 2, pp.135–145 (Jun. 1999).
Wenzel et al., "Flexural Plate–wave Gravimetric Chemical Sensor,"*Sensors and Actuators*, A21–A23, pp. 700–703 (1990).
Wenzel et al., "Analytic Comparison of the Sensitivities of Bulk–wave, Surface–wave, and Flexural Plate–wave Ultrasonic Gravimetric Sensors," *Applied Physics Lett.*, vol. 54, No. 20 pp. 1976–1978 (May 15, 1989).

* cited by examiner

Primary Examiner—Mark O. Budd
(74) Attorney, Agent, or Firm—Testa, Hurwitz, & Thibeault, LLP (57) ABSTRACT

A resonator with mechanical node reinforcement includes a substrate, an intermediate portion adjacent to the substrate, and a resonant portion adjacent to the intermediate portion. The intermediate portion may include multiple layers, such as an insulating layer and/or a conductive layer. The resonant portion of the resonator is adapted for an oscillation mode with a nodal point located within its periphery. Preferably, the resonant portion contacts the intermediate portion at points located at the periphery and at the nodal point. The resonant portion may include multiple layers and its primary layer may be a membrane or a plate. An alternative embodiment of the resonator excludes the intermediate layer allowing the resonant portion to contact the substrate instead of the intermediate layer.

16 Claims, 9 Drawing Sheets

RESONATOR WITH PREFERRED OSCILLATION MODE

TECHNICAL FIELD

This invention relates to resonators and, more particularly, to plate wave resonators that may be part of a micro electro mechanical system.

BACKGROUND INFORMATION

Various types of resonators including surface acoustic wave (SAW) crystals, quartz oscillators, flexure plate wave devices, are known. However, each known type of resonator has its drawbacks.

SAW devices are by nature relatively large, on the order of a centimeter, due to their long wavelength and the need for many reflecting fingers at each end to trap surface acoustic energy. The mass involved in the resonant motion of a SAW device is relatively large, on the order of one acoustic wavelength in depth times the product of area of the device and the density. Plate wave devices have a much smaller mass involved in the resonant motion since the thickness of the plate wave device is typically much smaller than a wavelength of the acoustic wave. The large mass involved in SAW oscillation makes them less sensitive to small mass perturbations than plate wave oscillators. Due to their high frequency, SAW devices also consume more power than lower frequency resonators.

Quartz resonators also have the disadvantage that the mass involved in oscillation is quite large, resulting in low sensitivity to small mass perturbations. This holds for shear mode, thickness mode, and tuning fork quartz oscillators.

Known plate wave resonators are capable of oscillating in many closely spaced modes. This capability makes it difficult for circuits including the resonators to stabilize the resonators on a single mode and results in "mode hopping" or frequency instability. Frequency instability is a recurring problem for known plate wave resonators. For example, mode hopping represents a noise source which limits the reliability of the oscillation mode of the resonator as a reference. Also, when resonators are used as sensors, frequency instability reduces their detection sensitivity. Apodization of the electrodes associated with the resonators has been used to ameliorate frequency instability. Apodization, however, leaves several modes of equal amplitude in which a resonator can oscillate and is therefore at best only a partial solution.

Accordingly, the need for a small, low power, single mode micro-machined resonator remains.

SUMMARY OF THE INVENTION

In one aspect, the invention features a resonator with mechanical node reinforcement comprising a substrate, an intermediate portion, and a resonant portion. The intermediate portion is adjacent to the substrate. The resonant portion is adjacent to the intermediate portion and is defined by a periphery. The resonant portion is also adapted for a first oscillation mode with a nodal point located within the periphery; the resonant portion contacts the intermediate portion only at points located substantially at the periphery and substantially at the nodal point.

In a similar aspect, the invention features a resonator with mechanical node reinforcement comprising a substrate and a resonant portion. The resonant portion is adjacent to the intermediate portion and is defined by a periphery. The resonant portion is also adapted for a first oscillation mode with a nodal point located within the periphery. According to one preferred embodiment, the resonant portion contacts the substrate at points located substantially at the periphery and substantially at the nodal point.

Embodiments of the two foregoing aspects of the invention may include the following features: a contact point located substantially at the nodal point that interferes with an unwanted oscillation mode; a plurality of nodal points within the periphery substantially at which the resonant portion contacts the underlying structure; and a resonant portion affixed to the underlying structure substantially at the nodal point and, in some embodiments, at the periphery.

In some embodiments, the resonant portion and/or the intermediate portion comprises layers of materials selected for a particular means of exciting the oscillation mode. In one embodiment, for example, the intermediate portion comprises a conductive layer and the resonant portion comprises a structural layer adjacent to the intermediate portion and an electrode layer adjacent to the structural layer. In another embodiment, the resonant portion comprises a structural layer adjacent to the intermediate portion, a conductive layer adjacent to the structural layer, a piezoelectric layer adjacent to the conductive layer, and an electrode layer adjacent to the piezoelectric layer. In another embodiment, the piezoelectric layer of the foregoing embodiment is replaced with a ferroelectric layer.

In some embodiments, the resonator is adapted for a particular application. In one embodiment, for example, the resonator further comprises a drive transducer coupled to the resonant portion, and adapted for converting a first electrical signal into a wave in the resonant portion, and a sense transducer coupled to the resonant portion, and adapted for converting the wave in the resonant portion into a second electrical signal. In another embodiment, the resonator further comprises an amplitude control device coupled to the sense transducer, and adapted for calculating a variance by comparing an amplitude represented by the second electrical signal to an amplitude set point, and a phase shift device coupled to the drive transducer, and adapted for transmitting a third electrical signal to the drive transducer based on the variance. In another embodiment, the resonator further comprises a film on the resonant portion that has at least one property that changes upon exposure to an agent and affects the first oscillation mode thereby enabling the resonator to operate as a sensor.

In another aspect, the invention features a method of manufacturing a resonator with mechanical node reinforcement comprising applying an intermediate portion to a substrate, applying a sacrificial layer to the intermediate portion, applying a resonant portion to the sacrificial layer and the intermediate portion. The sacrificial layer is defined by a periphery, and is particularly adapted for an oscillation mode with a nodal point located within the periphery. The sacrificial layer also has a void located substantially at the nodal point. The resonant portion extends beyond the periphery of the sacrificial layer and contacts the intermediate portion at the void. This aspect also features removing the sacrificial layer such that a gap remains between the intermediate portion and the resonant portion.

In a similar aspect, the invention features a method of manufacturing a resonator with mechanical node reinforcement comprising applying a sacrificial layer to a substrate, then applying a resonant layer to the sacrificial layer and the substrate. The sacrificial layer is defined by a periphery, and particularly adapted for an oscillation mode with a nodal point located within the periphery; the sacrificial layer has a void located substantially at the nodal point. The resonant layer extends beyond the periphery of the sacrificial layer and extends through the sacrificial layer to contact the substrate at the void. This aspect also features removing the sacrificial layer such that a gap remains between the substrate and the resonant layer.

Embodiments of the two foregoing aspects of the invention may include the following features: creating the void in the sacrificial layer by etching the sacrificial layer; sealing the gap in a vacuum; creating a sacrificial layer with a plurality of voids located substantially at a plurality of nodal points associated with a desired oscillation mode and located within the periphery of the sacrificial layer; and affixing the resonant portion to the sacrificial layer and to the intermediate portion or, if no intermediate portion is applied, to the substrate.

In some embodiments the method of manufacturing the resonator is adapted for a particular means of exciting the oscillation mode. In one embodiment, for example, the method further comprises applying a conductive layer to the substrate, applying a structural layer to the sacrificial layer and the intermediate portion, and applying an electrode layer to the structural layer. In another embodiment, the method further comprises applying a structural layer to the sacrificial layer and to the intermediate portion or, if no intermediate portion is applied, to the substrate, applying a conductive layer to the structural layer, applying a piezoelectric layer to the conductive layer, and applying an electrode layer to the piezoelectric layer. In another embodiment, the application of the piezoelectric layer in the foregoing embodiment is replaced by the application of a ferroelectric layer.

In some embodiments, the method of manufacturing is adapted for a particular application. In one embodiment, for example, the method further comprises applying a drive transducer to the resonant portion, the drive transducer converting a first electrical signal into a wave in the resonant portion, and applying a sense transducer to the resonant portion, the sense transducer converting the wave in the resonant portion into a second electrical signal. In another embodiment, the method further comprises putting an amplitude control device in electrical signal communication with the sense transducer, the amplitude control device calculating a variance by comparing an amplitude represented by the second electrical signal to an amplitude set point, and putting a phase shift device in electrical signal communication with the drive transducer, the phase shift device transmitting a third electrical signal to the drive transducer based on the variance. In another embodiment, the method further comprises applying to the resonant portion a film with at least one property that changes upon exposure to an agent and that affects the oscillation mode of the resonant layer.

The foregoing and other objects, aspects, features, and advantages of the invention will become more apparent from the following description and from the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIGS. 4A, 4B, and 4C are different views of a resonator in accordance with one embodiment of the invention. FIG. 4A is top view of the resonator.

FIGS. 5A, 5B, and 5C are different views of a resonator in accordance with one embodiment of the invention. FIG. 5A is top view of the resonator.

FIGS. 6A and 6B are different views of a resonator in accordance with one embodiment of the invention. FIG. 6A is top view of the resonator.

FIGS. 7A, 7B, 7C, and 7D are illustrations of various modes of oscillation of a rectangular resonant portion of a resonator. FIG. 7A illustrates a (1,1) mode. FIG. 7B illustrates a (2,1) mode. FIG. 7C illustrates a (1,2) mode. FIG. 7D illustrates a (2,2) mode.

DESCRIPTION OF ILLUSTRATIVE EMBODIMENTS

In brief, the present invention relates to a resonator with a preferred oscillation mode and a method of manufacturing a resonator with a preferred oscillation mode. In one respect, the use of internal nodal points to suppress undesired modes distinguishes the resonator of the present invention from previously known resonators. The nodal points enable the resonator of the present invention to oscillate in the desired mode unimpeded. Further, a resonator with a single fundamental oscillation mode may be attained through the use of the internal nodal points. Accordingly, the electronics associated with the resonator of the present invention can be simplified because the electronics do not have to overcome the tendency of previously known resonators to hop from one oscillation mode to another. Mode hopping may be ameliorated or overcome entirely with the present invention.

Figure 1:
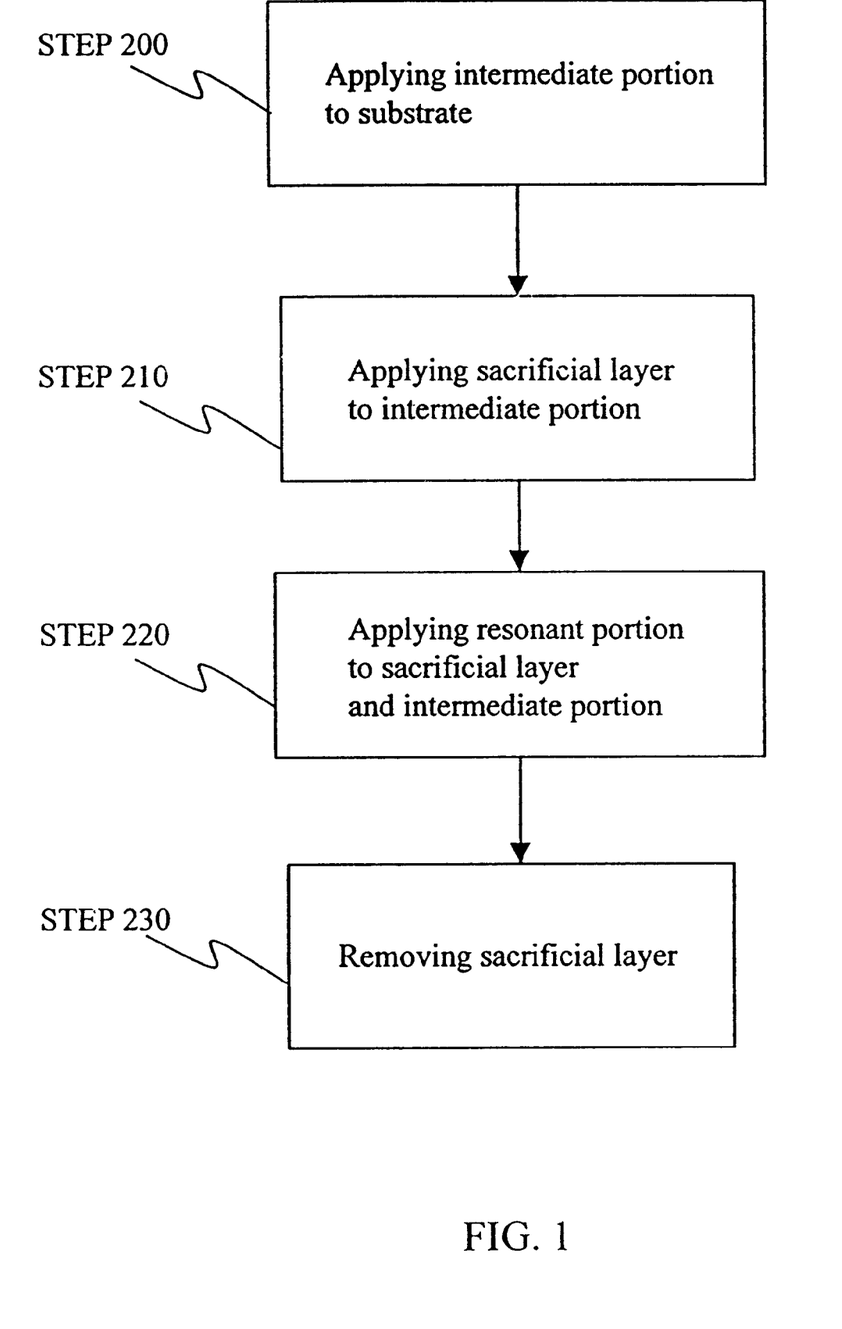
FIG. 1 is flow chart describing a method of manufacturing a resonator with a preferred oscillation mode according to one illustrative embodiment of the invention.

In one illustrative embodiment of the present invention, the method of manufacturing the resonator comprises the steps illustrated in FIG. 1. The first step in the method (STEP 200) is to apply an intermediate portion to a substrate. In one embodiment, the substrate is a silicon chip. In another embodiment, the substrate is made of another appropriate material such as glass. In some embodiments, the application of the intermediate portion comprises the application of a single layer. In other embodiments, the application of the intermediate portion comprises the application of multiple layers. In some embodiments, the application of the intermediate portion further comprises the application of at least one layer consistent with a specific means for exciting the oscillation mode. In one embodiment, the application of a layer of the intermediate portion comprises the application of a conductive layer. In another embodiment, the application of a layer of the intermediate portion comprises the application of an insulating layer.

The second step in the method (STEP 210) is to apply a sacrificial layer to the intermediate portion. The sacrificial layer is defined by a periphery and adapted to an oscillation mode with at least one nodal point within the periphery. The final sacrificial layer has at least one void located substantially at a nodal point within the periphery. The location of each void in the sacrificial layer is consistent with the preferred oscillation mode. In one embodiment, a void in the sacrificial layer is created by etching a small hole in an existing sacrificial layer. In another embodiment, the sacrificial layer is created with an appropriate void. In one embodiment, the application of the sacrificial layer comprises the application of silicon dioxide. In other embodiments, the application of the sacrificial layer comprises the application of phospho-silicate glass (PSG) or another appropriate material. Typically, the means for creating the voids is consistent with the material selected for the sacrificial layer.

The third step in the method (STEP 220) is to apply a resonant portion to the sacrificial layer and the intermediate portion. The resonant portion covers the sacrificial layer after it is applied. The resonant portion is applied to the intermediate portion outside the periphery of the sacrificial layer and through the voids in the sacrificial layer. In one embodiment, the application of the resonant portion comprises the application of a single layer. In other embodiments, the application of the resonant portion comprises the application of multiple layers. In some embodiments, the resonant portion includes a membrane as a structural element. In other embodiments, the resonant portion includes a plate as a structural element. In various embodiments, the application of the structural element comprises the application of silicon, poly-silicon, silicon nitride, silicon carbide, or silicon dioxide. In some embodiments, the application of the resonant portion further comprises the application of at least one layer consistent with a specific means for exciting the oscillation mode.

The fourth step in the method (STEP 230) is to remove the sacrificial layer. Typically, the means of removal of the sacrificial layer is consistent with the material selected for the sacrificial layer. In some embodiments, the removal of the sacrificial layer first comprises cutting a small hole in the resonant portion. In embodiments, such as those in which the sacrificial layer is made of silicon dioxide or PSG, the sacrificial layer is removed by solutions containing hydrofluoric acid. In other embodiments, such as those in which the sacrificial layer is made of carbon, the sacrificial layer is removed by oxidation at temperatures between 400° C. and 1200° C. In still other embodiments such as those in which the sacrificial layer is made of a polymer, the sacrificial layer can be removed with solvents or oxygen plasma treatments. The removal of the sacrificial layer leaves a gap between the intermediate portion and the resonant portion. In some embodiments, the method further comprises sealing the gap. In some such embodiments, the sealing is done in a vacuum. A layer created by chemical vapor deposition may be used to seal the gap.

Figure 2A:
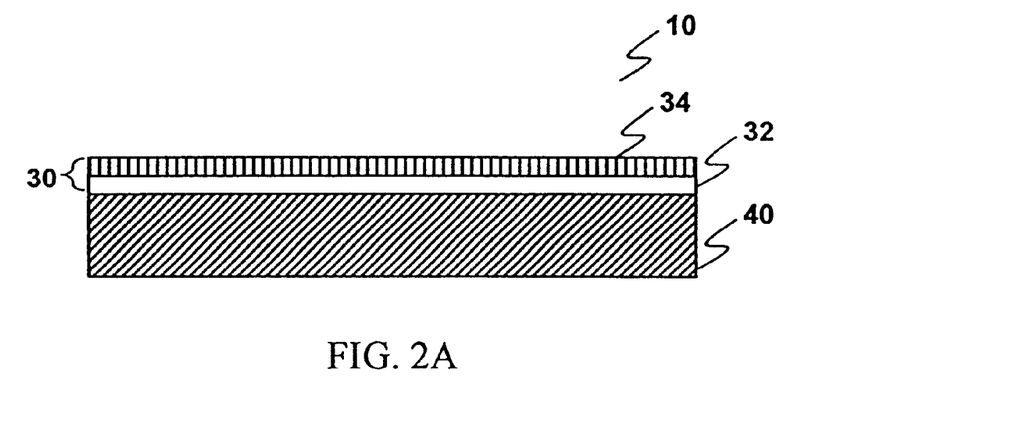
FIGS. 2A, 2B, 2C, 2D, 2E, and 2F are cross-sectional views of the same resonator during different phases of the manufacturing process according to one illustrative embodiment of the invention.

FIGS. 2A, 2B, 2C, 2D, 2E, and 2F illustrate cross-sectional views of a resonator 10, made in accordance with a detailed embodiment of the method of manufacturing described in FIG. 1, during different phases of the manufacturing process. Referring now generally to FIGS. 2A, 2B, 2C, 2D, 2E, and 2F, the first steps in the manufacture of the resonator 10 are the preparation of a substrate 40 and the application of the intermediate portion 30 to the substrate 40. In one example, the substrate 40 is a Silicon substrate that is from about 300 to 1000 $\mu$m thick. An insulating layer 32 is deposited on the substrate 40. The insulating layer 32 may, for example, be $SiO_2$ or $Si_3N_4$. In one example, the insulating layer 32 is $SiO_2$ with a thickness from about 0.1 to 2 $\mu$m deposited by chemical vapor deposition. Next a conductive layer 34 is deposited on the insulating layer 32. In one example, the conductive layer 34 is doped polysilicon with a thickness from about 0.1 to 2 $\mu$m deposited by chemical vapor deposition. The insulating layer 32 and the conductive layer 34 form the intermediate portion 30 of the resonator. FIG. 2A illustrates a cross-sectional view of the resonator after the completion of the application of the intermediate portion 30 to the substrate 40 (STEP 200).

Figure 2B:
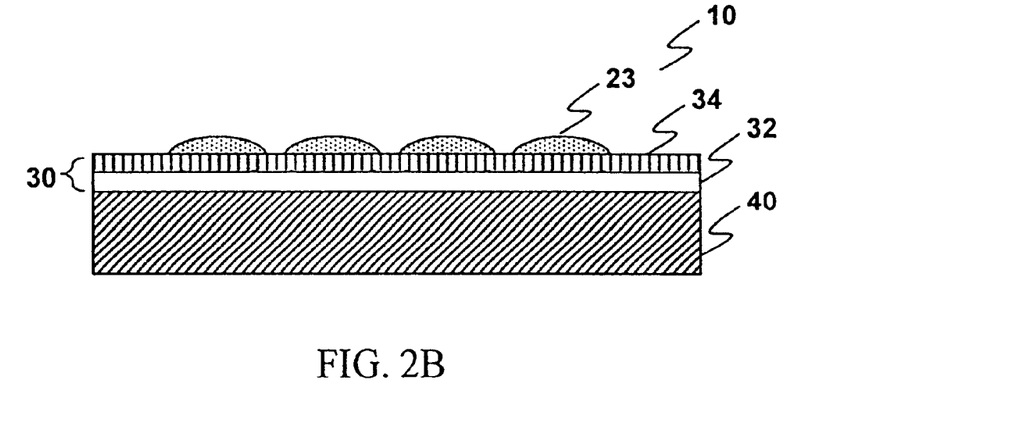

The next step (STEP 210) in the process of manufacturing resonator 10 illustrated by FIGS. 2A, 2B, 2C, 2D, 2E, and 2F is the application of the sacrificial layer 23 to the conductive layer 34. The sacrificial layer 23 may, for example, be $SiO_2$, PSG, carbon, or polymer. In one example, the sacrificial layer 23 is $SiO_2$ with a thickness from about 0.05 to 2 $\mu$m applied by chemical vapor deposition. In the associated first photolithography step, the sacrificial layer 23 is patterned by removing it at nodal points associated with the desired oscillation mode of the final resonator 10 and, if desired, at the periphery of the conductive layer 34. FIG. 2B illustrates the resonator 10 after the completion of the application of the sacrificial layer 23 to the intermediate portion 30 (STEP 210).

Figure 2C:
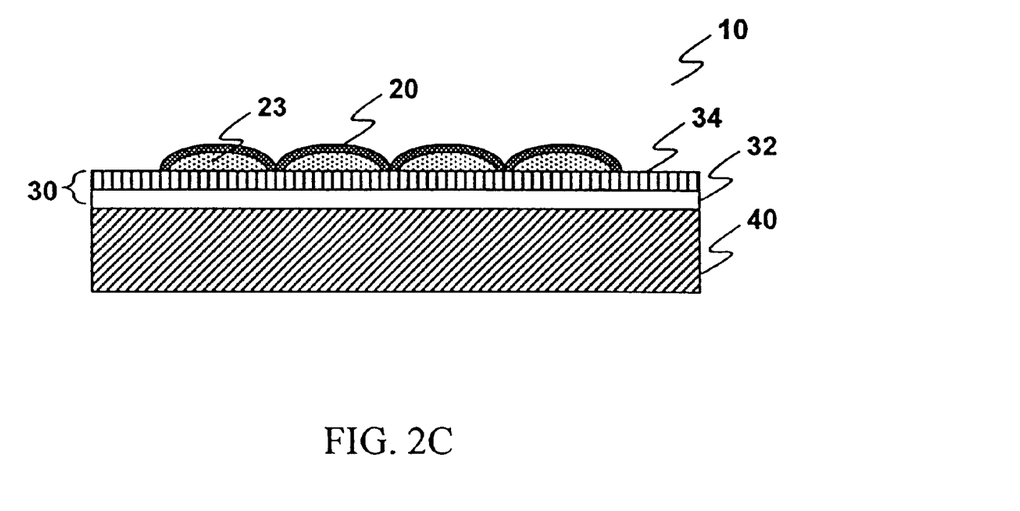
Figure 2D:
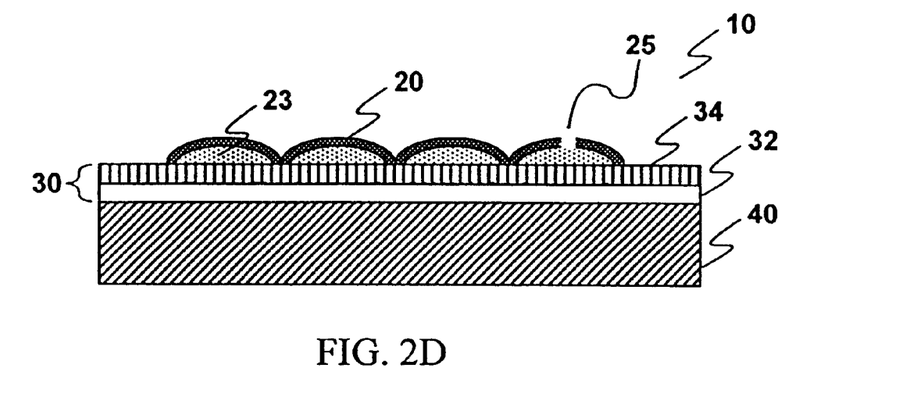

The next step (STEP 220) in the process of manufacturing resonator 10 illustrated by FIGS. 2A, 2B, 2C, 2D, 2E, and 2F is the application of the resonant portion 20 to the sacrificial layer 23 and the conductive layer 34. Specifically, the structural layer of the resonant portion 20 is applied. The structural layer may, for example, be made of polysilicon or silicon nitride. In one example, the structural layer of the resonant portion 20 is $Si_3N_4$ with a thickness from about 0.5 to 2 $\mu$m applied by chemical vapor deposition. FIG. 2C illustrates the resonator 10 after the completion of the application of the resonant portion 20 to the sacrificial layer 23 and the conductive layer 34. In the associated second photolithography step, the structural layer of the resonant portion 20 is patterned. At least one hole is etched into the structural layer of the resonant portion 20 to enable the removal of the sacrificial layer 23 from the resonator 10. FIG. 2D illustrates the resonator 10 with a hole etched in the structural layer of the resonant portion 20.

Figure 2E:
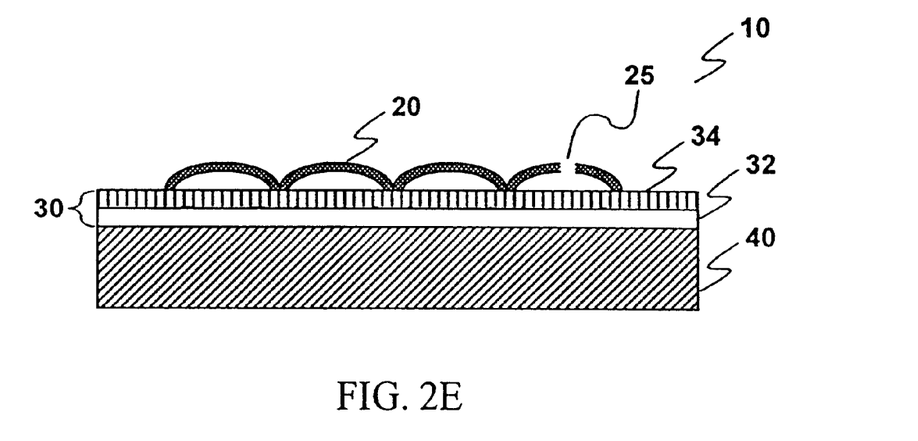

The next step (STEP 230) the process of manufacturing resonator 10 illustrated by FIGS. 2A, 2B, 2C, 2D, 2E, and 2F is the removal of the sacrificial layer 23 from the resonator 10. FIG. 2E illustrates the resonator 10 with after the sacrificial layer 23 has been removed. Table 1 below provides examples of etching techniques associated with various materials which may be used for the sacrificial layer.

TABLE 1

Structural Layer Materials and Corresponding Etches

| Sacrificial Layer Material | Sacrificial Layer Etch |
|---|---|
| $SiO_2$, PSG | HF containing solutions |
| Carbon | Oxygen at >500° C. |
| Polymer | Plasma Oxygen |

Figure 2F:
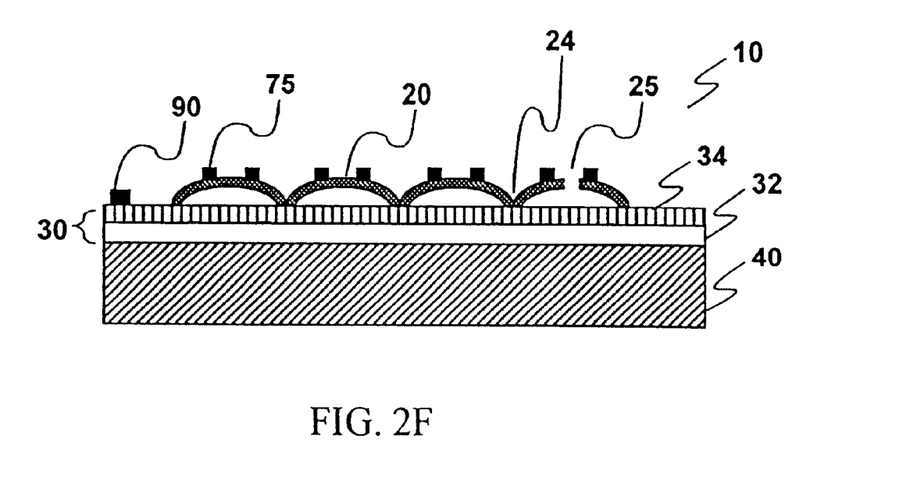

Once the sacrificial layer 23 has been removed, an electrode layer may be applied to the structural layer of the resonant portion 20. The electrode layer may be created by applying a conductive layer to the resonant portion 20 and then creating the desired pattern of electrodes using photolithography. Either the liftoff or etching type of photolithography may be used. The electrode layer may include a drive transducer and a sense transducer (not distinguished in FIG.

2F). FIG. 2F illustrates the complete resonator 10 after the electrode layer has been applied.

Figure 3:
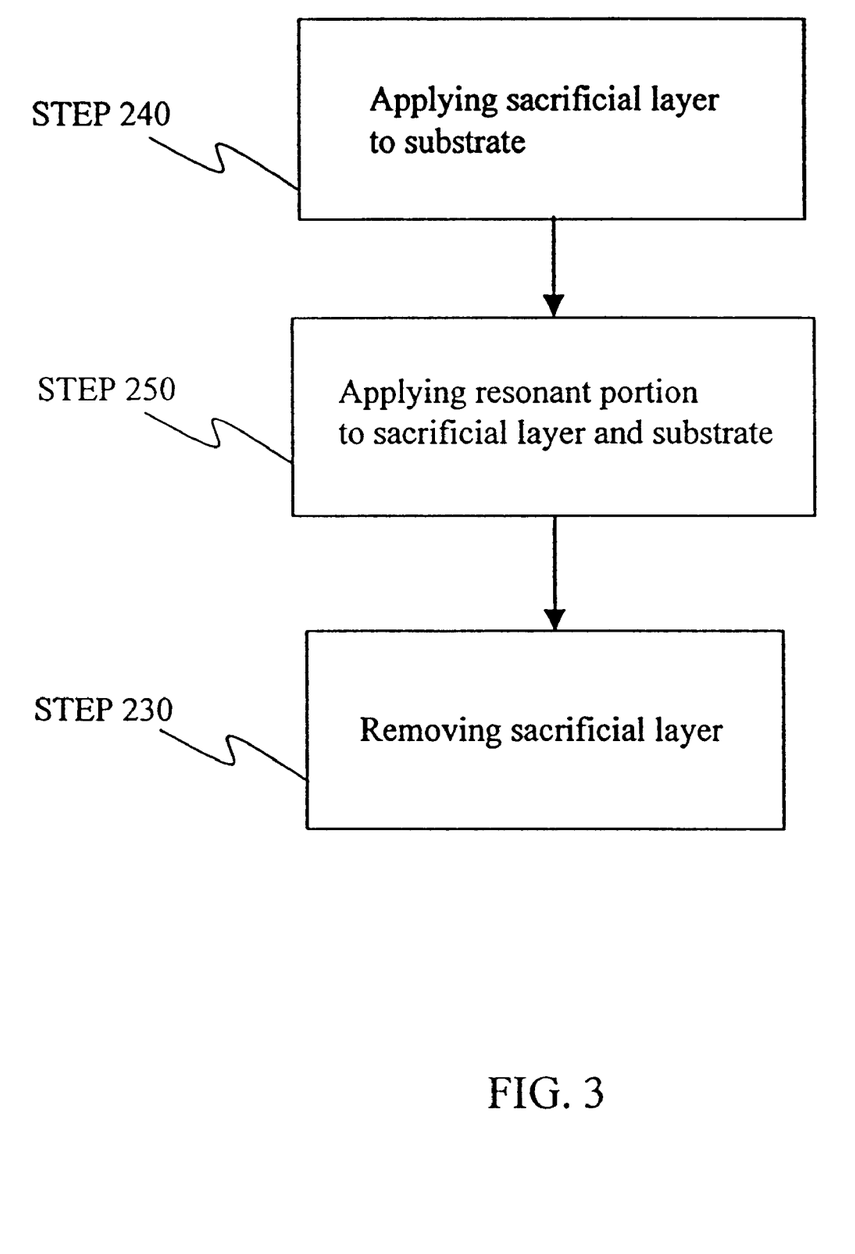
FIG. 3 is flow chart describing a method of manufacturing a resonator with a preferred oscillation mode according to another illustrative embodiment of the invention.

In another illustrative embodiment of the present invention, the method of manufacturing the resonator comprises the steps illustrated in FIG. 3. The first step in the method (STEP 240) is to apply a sacrificial layer to a substrate. The substrate and the sacrificial layer have the same variations as described for the previous illustrative embodiment of the invention. The second step in the method (STEP 250) is to apply a resonant portion to the sacrificial layer and the substrate. The resonant portion covers the sacrificial layer after it is applied. The resonant portion is applied to the substrate outside the periphery of the sacrificial layer and through the voids in the sacrificial layer. The application of the resonant portion has the same variations as described for the previous illustrative embodiment of the invention. The third step in the method (STEP 230) is to remove the sacrificial layer. The removal of the sacrificial layer is subject to the same variations as described for the previous illustrative embodiment.

Either of the foregoing illustrative embodiments may be adapted to suit a particular means for exciting an oscillation mode. For example, in one embodiment, the method is adapted to suit electrostatic actuation of an oscillation mode. In such an embodiment, the intermediate portion includes a conductive layer and the resonant portion includes a structural element and an electrode layer.

Figure 4A:
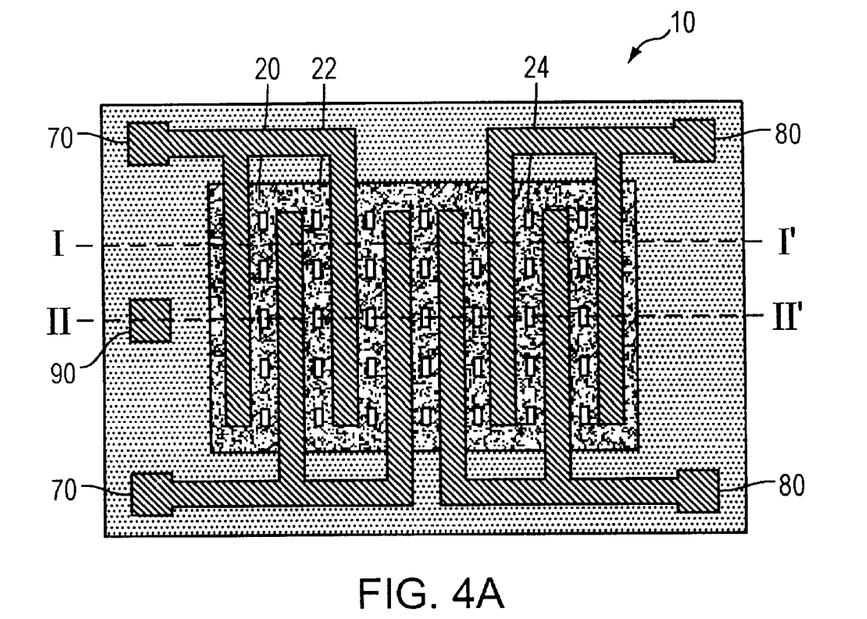
Figure 4B:
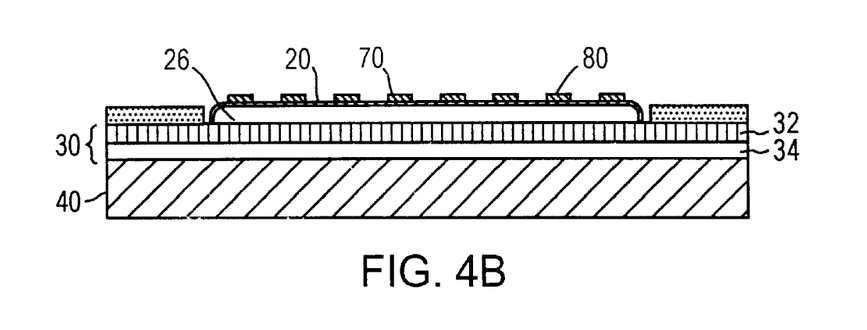
FIG. 4B is a cross-sectional view of the same resonator at the I—I' location.
Figure 4C:
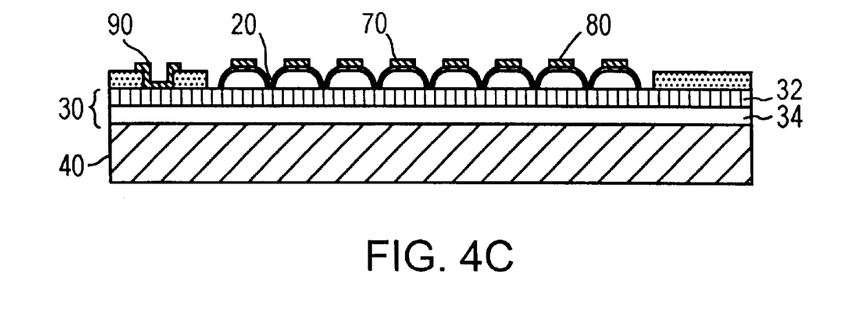
FIG. 4C is another cross-sectional view of the resonator at the II—II' location.

FIGS. 4A, 4B, and 4C illustrate a resonator with a preferred oscillation mode adapted to suit electrostatic actuation of the oscillation mode in accordance with an embodiment of the invention and generally designated 10. FIG. 4A is a top view of the resonator 10 that shows a resonant portion 20 with a periphery 22. The resonant portion 20 has a rectangular shape. The resonant portion 20 has a number of contact points 24 within the periphery 22 at which the resonant portion 20 contacts the intermediate portion 30 (not shown in FIG. 4A) of the resonator 10. The contacts points 24 are located substantially at nodal points associated with preferred oscillation mode of the resonator. The resonator 10 also includes a ground contact 90, a pair of drive transducers 70 and a pair of sense transducers 80 that partially cover the resonant portion 20.

FIG. 4B is a cross-sectional view of resonator 10 at the I—I' location. The cross-section generally shows a substrate 40, an intermediate portion 30, and a resonant portion 20. In the embodiment in FIG. 4B, the intermediate portion 30 includes an insulating layer 34 adjacent to the substrate 40 and a conductive layer 32 adjacent to the insulating layer 34. A gap 26 exists between the resonant portion 20 and the intermediate portion 30. The cross-section revealed in FIG. 4B is consistent with the prior art in that there is no contact point 24 at which the resonant portion 20 contacts the intermediate portion 30 substantially at a nodal point within the periphery 22 associated with the preferred oscillation mode.

The electrode layer of the resonator illustrated in FIGS. 4A, 4B, and 4C includes a pair of drive transducers 70 and a pair of sense transducers 80. Each pair of transducers illustrated in FIG. 4A has digits which cover part of the resonant portion and metal leads which connect to the digits and cover part of the intermediate portion. The metal leads are also known as metal interconnects. Each pair of transducers is interdigitated. Portions of the pair of drive transducers 70 and the pair of sense transducers 80 that cover the resonant portion 20 are shown in FIGS. 4A, 4B, and 4C. These portions of the transducers oscillate with resonant portion 20 and may be considered a layer of the resonant portion 20.

FIG. 4C is a cross-sectional view of resonator 10 at the II—II' location. Again, the cross-section generally shows a substrate 40, an intermediate portion 30, and a resonant portion 20. Unlike FIG. 4B, FIG. 4C illustrates the contact points 24 in the resonant portion 20. The contact points 24 constrain the modes at which the resonant portion 20 may oscillate and suppress alternative modes of oscillation of the resonator 10. This effect is analogous to that of a musician tuning a stringed instrument by lightly placing a finger at a nodal point of the desired oscillation mode. The contact points 24 do little to suppress oscillation in the preferred oscillation mode. As FIG. 4C illustrates, in a preferred embodiment, the digits of the pair of drive transducers 70 and the pair of sense transducers 80 that cover the resonant portion 20 are offset from the contact points 24. The placement of the digits between any nodal points associated with the preferred oscillation mode will in general maximize their effectiveness.

In another embodiment, the method of FIG. 1 or FIG. 3 is adapted for manufacturing a resonator suitable for piezoelectric actuation of an oscillation mode. In such an embodiment, the resonant portion comprises a structural layer, a conductive layer, a piezoelectric layer, and an electrode layer. In various embodiments, the piezoelectric layer is comprised of AlN, ZnO, CdS, ZnS, GaAs, or another piezoelectric material. In one such embodiment, the structural layer is adjacent to the intermediate portion or, if no intermediate portion is included in the resonator, to the substrate. The conductive layer is adjacent to the structural layer, the piezoelectric layer is adjacent to the conductive layer, and the electrode layer is adjacent to the piezoelectric layer.

Figure 5A:
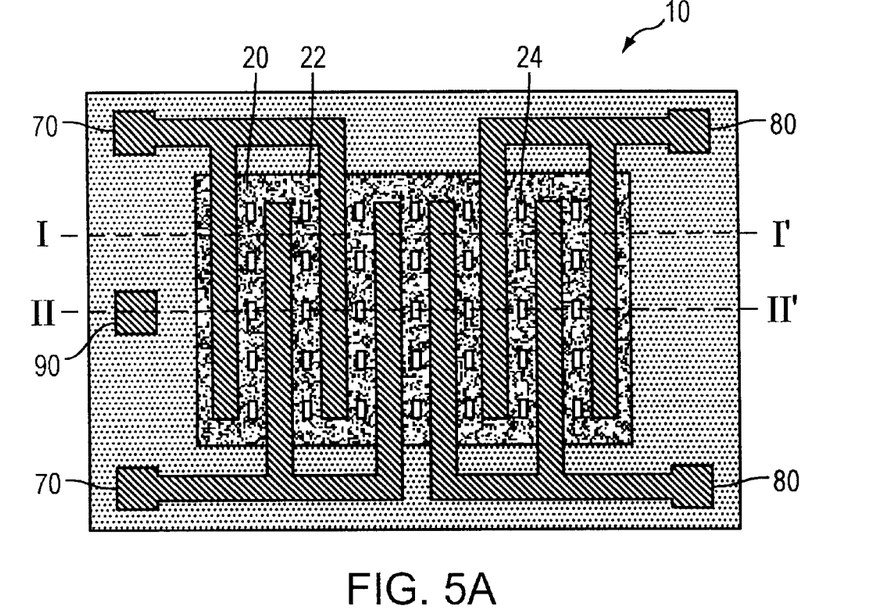
Figure 5B:
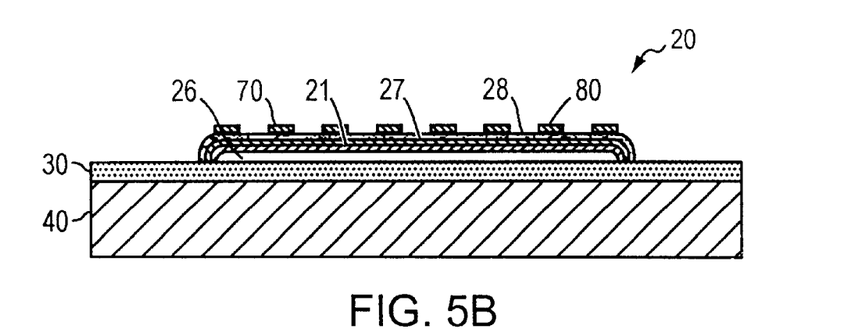
FIG. 5B is a cross-sectional view of the same resonator at the I—I' location.
Figure 5C:
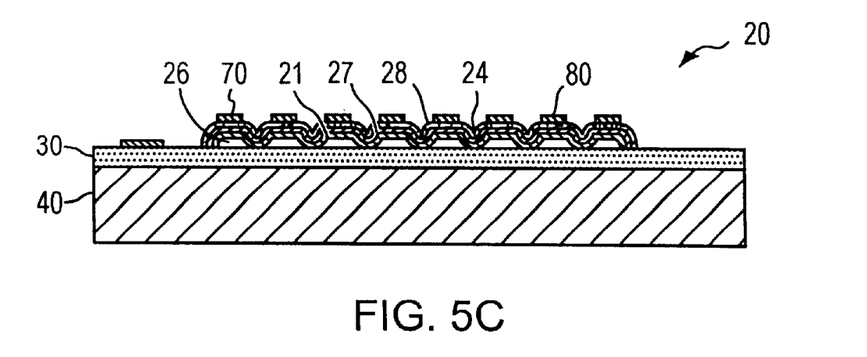
FIG. 5C is another cross-sectional view of the resonator at the II—II' location.

FIGS. 5A, 5B, and 5C illustrate a resonator with a preferred oscillation mode adapted to suit piezoelectric actuation of the oscillation mode in accordance with the foregoing embodiment of the invention and generally designated 10. FIG. 5A is a top view of the resonator 10 that shows a resonant portion 20 with a periphery 22. The resonant portion 20 has a rectangular shape. The resonant portion 20 has a number of contact points 24 within the periphery 22 at which the resonant portion 20 contacts the intermediate portion 30 (not shown in FIG. 5A) of the resonator 10. The contacts points 24 are located substantially at nodal points associated with the preferred oscillation mode of the resonator. The resonator 10 also includes a pair of drive transducers 70 and a pair of sense transducers 80 that partially cover the resonant portion 20.

FIG. 5B is a cross-sectional view of resonator 10 at the I—I' location. The cross-section generally shows a substrate 40, an intermediate portion 30, and a resonant portion 20. In the embodiment in FIG. 5B, the intermediate portion 30 comprises a insulating layer adjacent to the substrate 40. A gap 26 exists between the resonant portion 20 and the intermediate portion 30. The resonant portion 20 comprises a structural layer 21, a conductive layer 27, and a piezoelectric layer 28. In one such embodiment, the structural layer 21 is adjacent to the intermediate portion, the conductive layer 27 is adjacent to the structural layer 21, and the piezoelectric layer 28 is adjacent to the conductive layer 27. The cross-section revealed in FIG. 5B is consistent with the prior art in that there is no contact point 24 at which the resonant portion 20 contacts the intermediate portion 30 substantially at a nodal point within the periphery 22 associated with the preferred oscillation mode.

The electrode layer of the resonator illustrated in FIGS. 5A, 5B, and 5C includes a pair of drive transducers 70 and a pair of sense transducers 80. Each pair of transducers illustrated in FIG. 5A has digits which cover part of the resonant portion and metal leads which connect to the digits and cover part of the intermediate portion. The metal leads are also known as metal interconnects. Each pair of transducers is interdigitated. Portions of the pair of drive transducers 70 and the pair of sense transducers 80 that cover the resonant portion 20 are shown in FIGS. 5A, 5B, and 5C. These portions of the transducers oscillate with resonant portion 20 and may be considered a layer of the resonant portion 20.

FIG. 5C is a cross-sectional view of resonator 10 at the II—II' location. Again, the cross-section generally shows a substrate 40, an intermediate portion 30, and a resonant portion 20. Unlike FIG. 5B, FIG. 5C illustrates the contact points 24 in the resonant portion 20. Like those shown in FIG. 3C, the contact points 24 in FIG. 5C constrain the modes at which the resonant portion 20 may oscillate and suppress alternative modes of oscillation of the resonator 10. The contact points 24 do little to suppress oscillation in the preferred oscillation mode. As FIG. 5C illustrates, in a preferred embodiment, the digits of the pair of drive transducers 70 and the pair of sense transducers 80 that cover the resonant portion 20 are offset from the contact points 24.

In another embodiment, the method of FIG. 1 or FIG. 3 is adapted for manufacturing a resonator suitable for ferroelectric actuation of an oscillation mode. In such an embodiment, the resonant portion comprises a structural layer, a conductive layer, a ferroelectric layer, and an electrode layer. In various embodiments, the ferroelectric layer is comprised of PZT, PLZT, or another ferroelectric material. In one such embodiment, the structural layer is adjacent to the intermediate portion or, if no intermediate portion is included in the resonator, to the substrate. The conductive layer is adjacent to the structural layer, the ferroelectric layer is adjacent to the conductive layer, and the electrode layer is adjacent to the ferroelectric layer. A ferroelectric layer must be poled before it is useful for actuation. If the piezoelectric layer 28 illustrated in FIGS. 5B and 5C were a ferroelectric layer 29, then FIGS. 5A, 5B, and 5C would illustrate a resonator adapted to suit ferroelectric actuation of an oscillation mode.

Figure 6A:
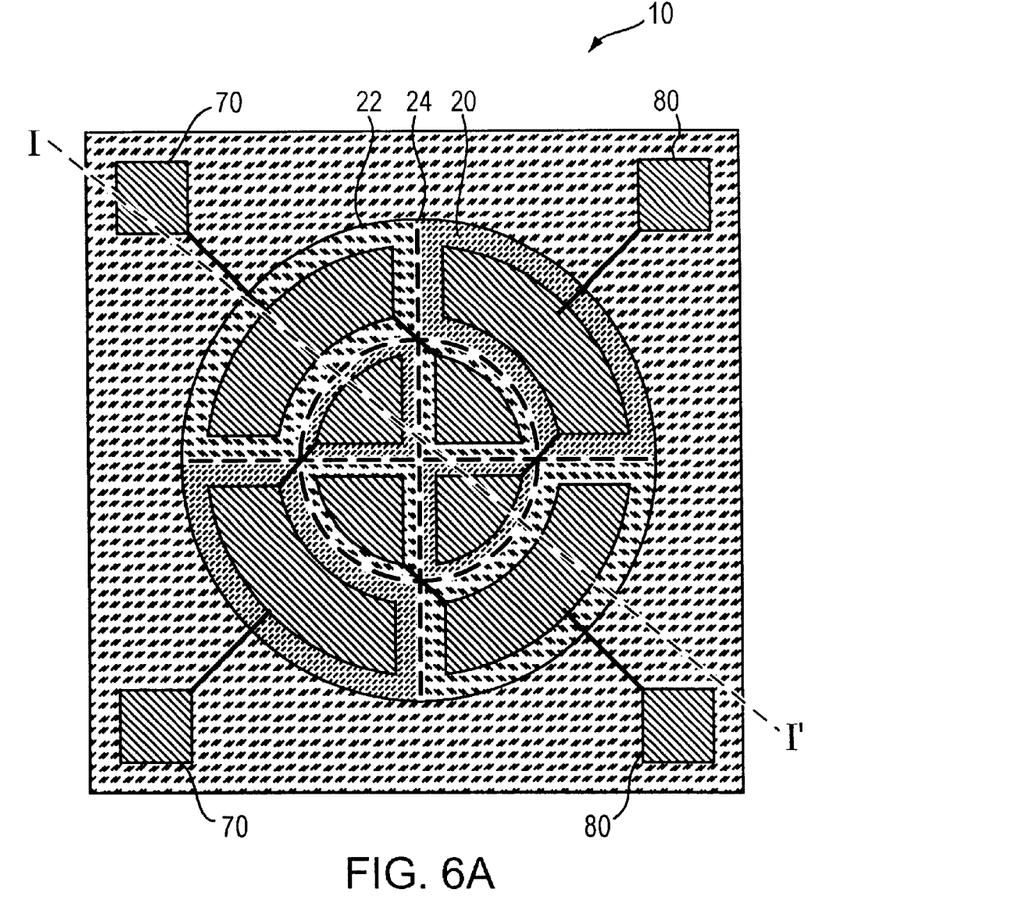
Figure 6B:
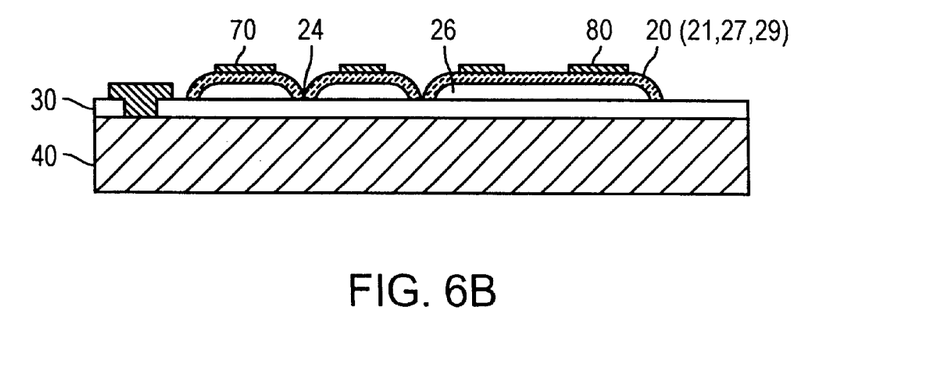
FIG. 6B is a cross-sectional view of the same resonator at the I—I' location.

FIGS. 6A and 6B illustrate a resonator with a preferred oscillation mode adapted to suit ferroelectric actuation of the oscillation mode in accordance with another embodiment of the invention and generally designated 10. FIG. 6A is a top view of the resonator 10 that shows a resonant portion 20 with a periphery 22. The resonant portion 20 has a generally circular shape. The preferred oscillation mode associated with FIGS. 6A and 6B is a (2,2) oscillation mode. The resonant portion 20 has a number of contact points 24 within the periphery 22 at which the resonant portion 20 contacts the intermediate portion 30 (not shown in FIG. 6A) of the resonator 10. The contacts points 24 are located substantially at nodal points associated with preferred oscillation mode of the resonator. The resonator 10 also includes a pair of drive transducers 70 and a pair of sense transducers 80 that partially cover the resonant portion 20.

FIG. 6B is a cross-sectional view of resonator 10 at the I—I' location. The cross-section generally shows a substrate 40, an intermediate portion 30, and a resonant portion 20. In the embodiment in FIG. 6B, the intermediate portion 30 comprises a insulating layer adjacent to the substrate 40. A gap 26 exists between the resonant portion 20 and the intermediate portion 30. The resonant portion 20 comprises a structural layer 21, a conductive layer 27, and a ferroelectric layer 29. In one such embodiment, the structural layer 21 is adjacent to the intermediate portion, the conductive layer 27 is adjacent to the structural layer 21, and the ferroelectric layer 29 is adjacent to the conductive layer 27. FIG. 6B illustrates the contact points 24 in the resonant portion 20. Like those shown in FIGS. 4C and 5C, the contact points 24 in FIG. 6C constrain the modes at which the resonant portion 20 may oscillate and suppress alternative modes of oscillation of the resonator 10. The contact points 24 do little to suppress oscillation in the preferred oscillation mode.

The electrode layer of the resonator illustrated in FIGS. 6A and 6B includes a pair of drive transducers 70 and a pair of sense transducers 80. Each pair of transducers illustrated in FIG. 6A has a portion which extends from the intermediate portion to cover part of the resonant portion. Portions of the pair of drive transducers 70 and the pair of sense transducers 80 that cover the resonant portion 20 are shown in FIGS. 6A and 6B. These portions of the transducers will oscillate with resonant portion 20 and may be considered a layer of the resonant portion 20. As FIG. 6B illustrates, in a preferred embodiment, the portions of the pair of drive transducers 70 and the pair of sense transducers 80 that cover the resonant portion 20 are generally offset from the contact points 24.

If the ferroelectric layer 29 indicated in FIG. 6B as part of the resonant portion 20 were replaced with a piezoelectric layer 28, then FIGS. 6A and 6B would illustrate a resonator adapted to suit piezoelectric actuation of an oscillation mode in accordance with another embodiment. Similarly, if the resonant portion 20 illustrated in FIG. 6B simply comprised an insulating layer, such as $Si_3N_4$, that supported the drive transducers 70 and sense transducers 80, then FIGS. 6A and 6B would illustrate a resonator adapted to suit electrostatic actuation of the oscillation mode in accordance with another embodiment.

The invention is not limited to a resonator with a resonant portion that is rectangular. Nor is the invention limited to a resonator with a resonant portion that is circular. Resonators with rectangular and circular resonant portions are illustrative of some of the embodiments of the invention. Other embodiments of the invention include resonant portions of diverse shapes. In each such embodiment, the resonant portion has at least one contact point located substantially at a nodal point within its periphery associated with the preferred oscillation mode.

Figure 7A:
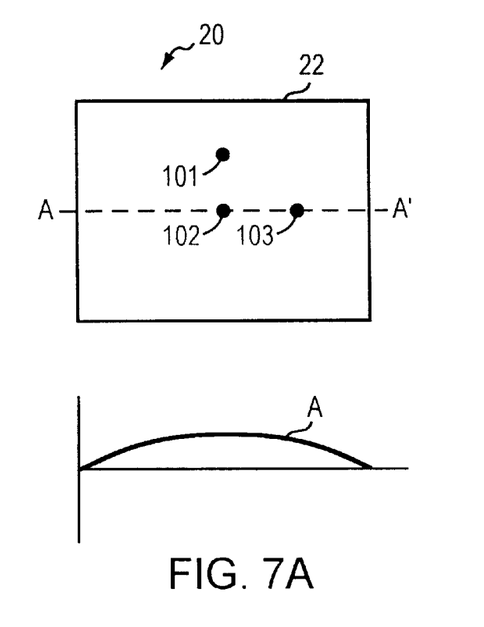
Figure 7B:
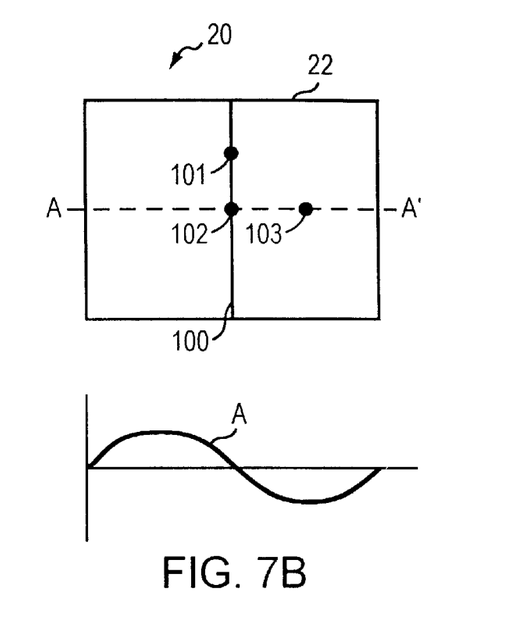
Figure 7C:
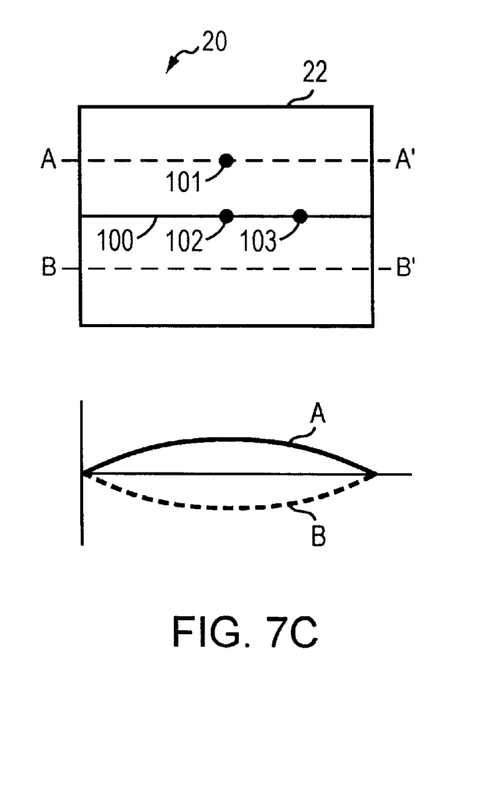
Figure 7D:
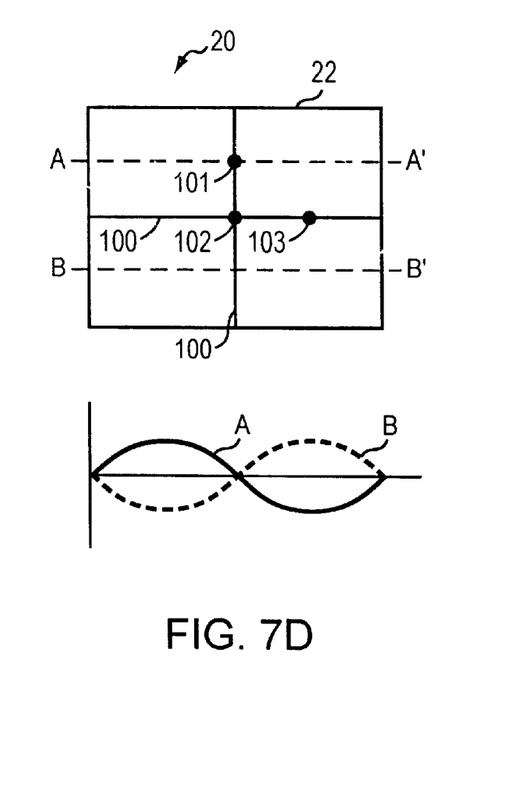

FIGS. 7A, 7B, 7C, and 7D are useful in understanding the process of selecting a contact point to incorporate into a resonator with a preferred oscillation mode during the manufacturing process. Each of FIGS. 7A, 7B, 7C, and 7D illustrate a resonant portion 20 with a periphery 22. FIG. 7A illustrates an oscillation mode that has no nodal point within the periphery 22. Each of FIGS. 7B, 7C, and 7D illustrate an oscillation mode with a line of nodal points 100 within the periphery 22 of the resonant portion 20. At least one cross section of the resonant portion at an instant in time is shown below the resonant portion 20 in each figure. Points 101, 102, and 103 illustrate possible locations for a contact point within the periphery of the resonant portion. FIGS. 7A, 7B, 7C, and 7D do not describe all of the possible oscillation modes for a resonant portion 20 with a rectangular shape.

Considering that a contact point suppresses oscillation at its location, it is evident that a contact point will interfere with any oscillation mode in which the contact point is not located either at the periphery of the resonant portion or at a nodal point associated with the oscillation mode. For example, if any one of points 101, 102, and 103 were a contact point, the contact point would interfere with the oscillation mode (1,1) illustrated in FIG. 7A. Similarly, if point 103 were a contact point, it would interfere with the oscillation mode (2,1) illustrated in FIG. 7B; neither point 101 nor point 102 would interfere with the oscillation mode (2,1) illustrated in FIG. 7B if either were a contact point. Point 101 as a contact point would interfere with the oscillation mode (1,2) illustrated in FIG. 7C; neither point 102 nor point 103 would interfere as a contact point with the oscillation mode (2,1) illustrated in FIG. 7C. If any of points 101, 102, or 103 were a contact point, it would not interfere with the oscillation mode (2,2) illustrated in FIG. 7D. The selection of contact points limits the possible oscillation modes. For example, if points 101, 102, 103 were all contact points, then the contact points would suppress oscillation in the three oscillation modes illustrated in FIGS. 7A, 7B, and 7C.

Nodal points inside the periphery of a resonant portion can be identified mathematically given the boundary conditions of the resonant portion. For example, the nodal points within the periphery of a circular resonant portion can be identified with the Bessel function. Alternatively, nodal points inside the periphery of a resonant portion can be defined experimentally. For example, a resonant portion of the desired shape may be driven to oscillate in a variety of modes and the nodal points associated with each of the various modes may be observed. For another example, a contact point may be created in a resonant portion of the desired shape and the effect of the contact point on the modes at which the resonant portion will oscillate may be observed. Finally, a combination of mathematical prediction and experimental validation may be used to identify a nodal point of interest. The identification of the preferred oscillation mode for a resonator should reveal at least one corresponding nodal point within the periphery of the resonant portion.

In some embodiments of the present invention, the contact points within the periphery of the resonant portion are the only points at which the resonant portion touches the intermediate portion or, if no intermediate portion is included in the resonator, the substrate. The resonant portion in these embodiment does not have a contact point at its periphery. This embodiment allows for oscillation modes in which the periphery of the resonant portion is unconstrained. In one such embodiment, the unconstrained periphery of the resonant portion is achieved by applying a sacrificial layer that covers the entire intermediate portion with the exception of at least one void that is located substantially at a nodal point within the periphery of the resonant portion associated with the preferred oscillation mode. In another such embodiment, the unconstrained periphery of the resonant portion is achieved by applying a sacrificial layer that covers the entire substrate with the exception of at least one void. In another such embodiment, the unconstrained periphery of the resonant portion is achieved by cutting the resonant portion at its desired periphery.

Referring now to the potential applications of the present invention, in embodiments based on any of the embodiments discussed above, the resonator can be adapted for use as a bandpass filter. In such embodiments, the method further comprises applying a drive transducer and a sense transducer to the resonant portion of the resonator. In some such embodiments, the drive transducer extends from the intermediate portion onto the resonant portion such that the drive transducer partially covers and may be considered part of the resonant portion. In some such embodiments, the drive transducer extends from the substrate onto the resonant portion such that the drive transducer partially covers and may be considered part of the resonant portion. In some such embodiments, the sense transducer extends from the intermediate portion onto the resonant portion such that the sense transducer partially covers and may be considered part of the resonant portion. The drive transducer is coupled to a first electrical signal. The drive transducer converts the first electrical signal into an oscillation in the resonant portion. The sense transducer is coupled to a second electrical signal. The sense transducer converts the oscillation in the resonant portion to the second electrical signal. Some modes of oscillation of the resonant portion are suppressed by the contact points. Accordingly, only some of oscillation modes are transmitted by the drive transducer through the resonant portion to the sense transducer.

Figure 8:
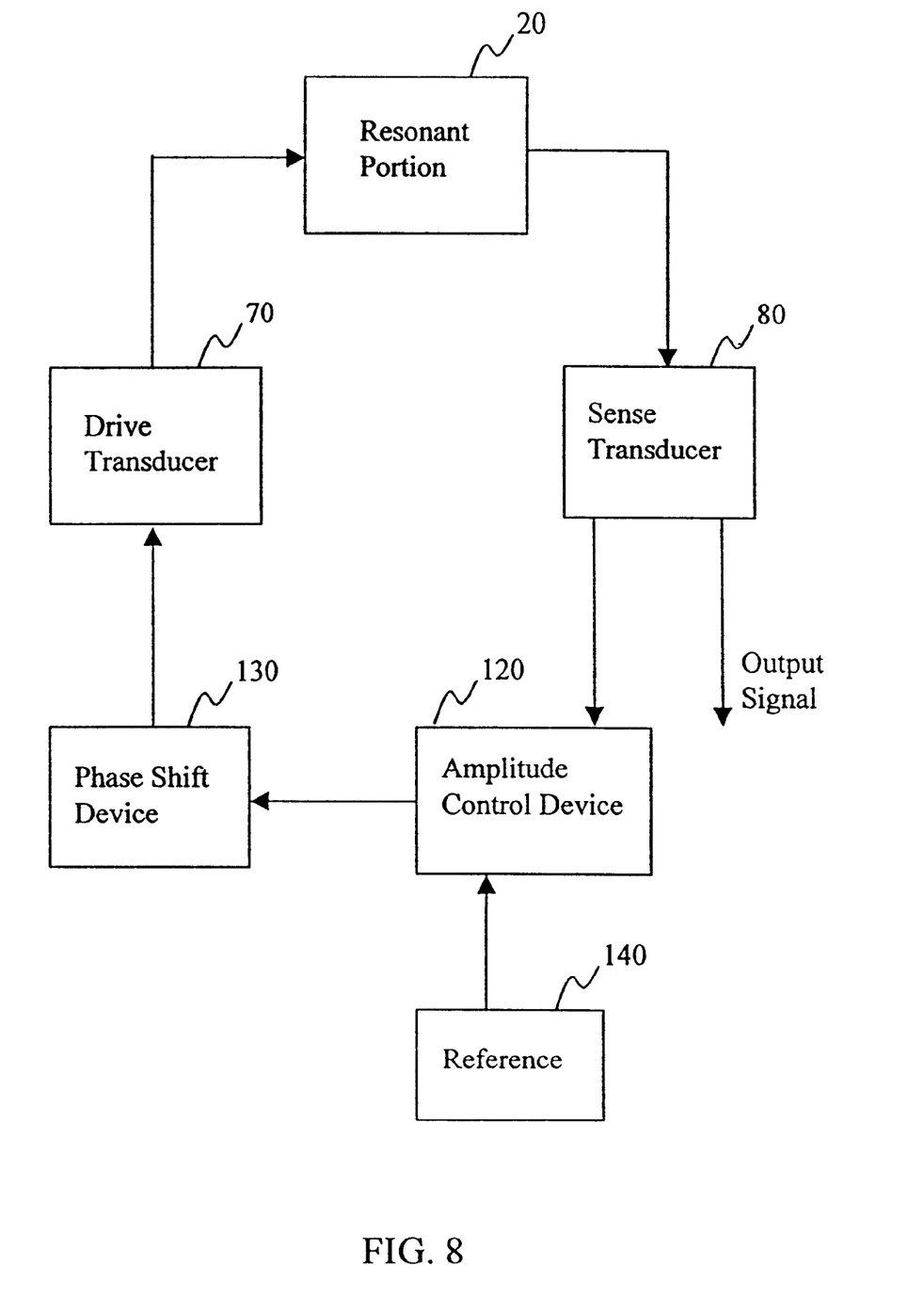
FIG. 8 is a block diagram of the resonator as a frequency reference.

In further embodiments based on any of the embodiments discussed above, the resonator can be adapted for use as a frequency reference. In such embodiments, the method further comprises putting an amplitude control device 120 in signal communication with the sense transducer 80 and putting a phase shift device 130 in signal communication with the drive transducer 70. FIG. 8 is a block diagram of a circuit which uses the resonator as a frequency reference. The amplitude control device 120 compares the signal from the sense transducer 80 to a reference, calculates a variance, and sends a signal to the phase shift device 130 based on the variance. The phase shift device 130 transmits a signal to the drive transducer 70 based on the signal from the amplitude control device 120. The signal from the phase shift device 130 is adapted to minimize the variance between the oscillation in the resonant portion 20 and the reference. The drive transducer 70 converts the signal from the phase shift device 130 into an oscillation in the resonant portion 20.

In further embodiments based on any of the embodiments discussed above, the resonator can be adapted for use as a sensor. In such embodiments, the method further comprises applying a film to the resonant portion of the resonator. The film has at least one property that changes upon exposure to an agent. In some embodiments, the film may be sensitive to more than one agent. The property of the film that changes upon exposure to the agent affects the oscillation of the resonant portion. In one embodiment, for example, the mass of the film changes upon exposure to the agent. In another embodiment, the elastic properties of the film change upon exposure to the agent. In one such embodiment, the stiffness of the film changes upon exposure to the agent. In another such embodiment, the damping characteristics of the film changes upon exposure to the agent.

In some embodiments, exposure of the film to an any level of an agent, as low as one part per billion or lower, changes a property of the film that effects the oscillation of the resonant portion. In such embodiments, the change in the property of the film may not be detectable at very low agent exposure levels because the effect of the exposure is not as great as the effects of other environmental conditions. In other embodiments, the film must be exposed to the agent above a threshold level before any change in the property of the film occurs or before oscillation of the resonant portion is affected.

In various embodiments, the agent is a chemically, physically, or biologically active principal. In some embodiments, the physically active principal is a change in an environmental condition, such as temperature, light, or sound. For example, in one embodiment, the agent is pressure. In another embodiment, the agent is force. In other embodiments, the film comprises a chemical or biological receptor. In one such embodiment, the film comprises an antibody and the agent comprises an antigen. In other such embodiments, the film comprises receptors capable of binding a particular chemical or biological agent, such as a viral surface protein. In such embodiments, the receptors can be selected to bind specifically or non-specifically to particular agents or classes of agents.

The film that is applied to adapt the resonator for use as a sensor may be applied in a variety of ways. In one embodiment for example, the film may be applied to the structural layer of the resonant portion. In another embodiment, the film is applied to the piezoelectric layer. In yet another embodiment, the film is applied to the ferroelectric layer. In some embodiments, an electrode layer is further applied to the film. In other embodiment, the film is applied on top of the electrode layer. In some embodiments, more than one film that has a property that affects the oscillation mode that changes upon exposure to an agent is applied. In one such embodiments, each of the films that are applied responds to a different agent.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A resonator with mechanical node reinforcement, the resonator comprising, a substrate, an intermediate portion adjacent to said substrate, and a resonant portion adjacent to said intermediate portion, said resonant portion being defined by a periphery, and being adapted for a first oscillation mode with a nodal point located within said periphery, wherein said resonant portion contacts said intermediate portion only at points located substantially at said periphery and substantially at said nodal point.

2. The resonator of claim 1 further comprising a contact point located substantially at said nodal point, said contact point interfering with a second oscillation mode.

3. The resonator of claim 1 wherein said resonant portion is adapted for a first oscillation mode with a plurality of nodal points located within said periphery, and wherein said resonant portion contacts said intermediate portion only at points located substantially at said periphery and substantially at said plurality of nodal points.

4. The resonator of claim 1 wherein said resonant portion is affixed to said intermediate portion only at points located substantially at said periphery and substantially at said nodal point.

5. The resonator of claim 1 wherein said intermediate portion comprises a conductive layer, and wherein said resonant portion comprises a structural layer adjacent to said intermediate portion and an electrode layer adjacent to said structural layer.

6. The resonator of claim 1 wherein said resonant portion comprises, a structural layer adjacent to said intermediate portion, a conductive layer adjacent to said structural layer, a piezoelectric layer adjacent to said conductive layer, and an electrode layer adjacent to said piezoelectric layer.

7. The resonator of claim 1 wherein said resonant portion comprises, a structural layer adjacent to said intermediate layer, a conductive layer adjacent to said structural layer, a ferroelectric layer adjacent to said conductive layer, and an electrode layer adjacent to said ferroelectric layer.

8. The resonator of claim 1 further comprising, a drive transducer coupled to said resonant portion, and adapted to convert a first electrical signal into a wave in said resonant portion, and a sense transducer coupled to said resonant portion, and adapted to convert said wave in said resonant portion into a second electrical signal.

9. The resonator of claim 8 further comprising, an amplitude control device coupled to said sense transducer, and adapted to calculate a variance by comparing an amplitude represented by said second electrical signal to an amplitude set point, and a phase shift device coupled to said drive transducer, and adapted to transmit a third electrical signal to said drive transducer based on said variance.

10. The resonator of claim 1 wherein said resonant portion comprises a membrane covered with a film, said film having at least one property that changes upon exposure to an agent, said at least one property affecting said first oscillation mode.

11. The resonator of claim 10 wherein said film comprises a chemical or biological receptor.

12. The resonator of claim 10 wherein said film comprises an antibody and said agent comprises an antigen.

13. The resonator of claim 10 wherein said film comprises a temperature-sensitive film and said agent comprises a change in temperature.

14. A resonator with mechanical node reinforcement, the resonator comprising, a substrate, and a resonant layer adjacent to said substrate, said resonant layer being defined by a periphery, and being adapted for an oscillation mode with a nodal point within said periphery, wherein said resonant layer contacts said substrate only at points located substantially at said periphery and substantially at said nodal point.

15. The resonator of claim 14 wherein said resonant layer is adapted for an oscillation mode with a plurality of nodal points within said periphery, and wherein said resonant layer contacts said substrate only at points located substantially at said periphery and substantially at said plurality of nodal points.

16. The resonator of claim 14 wherein said resonant layer is affixed to said substrate only at points located substantially at said periphery and substantially at said nodal point.

* * * * *

UNITED STATES PATENT AND TRADEMARK OFFICE
CERTIFICATE OF CORRECTION

PATENT NO. : 6,455,980 B1  Page 1 of 1
DATED : September 24, 2002
INVENTOR(S) : Bernstein

It is certified that error appears in the above-identified patent and that said Letters Patent is hereby corrected as shown below:

<u>Title page,</u>
Item [56], References Cited, add the following:
-- FOREIGN PATENT DOCUMENTS
03079113        04/04/91        JP
WO 00/42705     20/07/00        PCT
EP0 907 249 A2  07/04/99        EP --

--              OTHER PUBLICATIONS
K. Diekstall, "Anwendungen piezoeliktrischer Keramiken," 2087 <u>Elektronik</u>, Vol. 31, pp. 79 - 83 (1982) (original German language publication and English translation thereof, entitled K. Diekstall, "Applications of Piezoelectric Ceramics."). --

Signed and Sealed this

Seventeenth Day of December, 2002

JAMES E. ROGAN
*Director of the United States Patent and Trademark Office*